United States Patent [19]

Hosoya et al.

[11] Patent Number: 5,180,571
[45] Date of Patent: Jan. 19, 1993

[54] PROCESS FOR THE PREPARATION OF DIAMOND

[75] Inventors: Ikuo Hosoya; Yasuhiro Yoneyama, both of Sodegaura, Japan

[73] Assignee: Idemitsu Petrochemical Company Limited, Tokyo, Japan

[21] Appl. No.: 706,695

[22] Filed: May 29, 1991

[30] Foreign Application Priority Data

May 30, 1990 [JP] Japan .................................. 2-141014
Sep. 6, 1990 [JP] Japan .................................. 2-236112

[51] Int. Cl.$^5$ ............................................ C23C 16/26
[52] U.S. Cl. .......................... 423/446; 156/DIG. 68; 427/249
[58] Field of Search ........................ 423/446; 427/249; 204/157.47; 156/DIG. 68

[56] References Cited

U.S. PATENT DOCUMENTS 4,997,636  3/1991  Prins .................................. 423/446

FOREIGN PATENT DOCUMENTS

| | | |
|---|---|---|
| 320657 | 6/1989 | European Pat. Off. . |
| 343846 | 11/1989 | European Pat. Off. . |
| 137311 | 8/1984 | Japan . |
| 59-143498 | 8/1984 | Japan . |
| 63-57399 | 7/1985 | Japan . |
| 141697 | 7/1985 | Japan . |
| 60-231494 | 11/1985 | Japan . |
| 61-36112 | 2/1986 | Japan . |
| 151097 | 7/1986 | Japan . |
| 61-155292 | 7/1986 | Japan . |
| 61-161897 | 7/1986 | Japan . |
| 61-161898 | 7/1986 | Japan . |
| 63-156009 | 6/1988 | Japan . |
| 111707 | 4/1989 | Japan . |
| 242490 | 9/1989 | Japan . |
| 2219578 | 12/1989 | United Kingdom ................ 423/446 |
| WO8911897 | 12/1989 | World Int. Prop. O. . |

OTHER PUBLICATIONS

Proceedings of SPIE, vol. 1146, 1989, London, GB, pp. 144–151, 192, 200.

Primary Examiner—Michael Lewis
Assistant Examiner—Stephen G. Kalinchak
Attorney, Agent, or Firm—Nikaido, Marmelstein, Murray & Oram

[57] ABSTRACT

An interrupting layer of inorganic powder other than diamond is formed on the surface of a substrate and a surface of the interrupting layer is contacted with excited raw material gases containing a carbon source, under conditions suited to depositing of diamond on the interrupting layer. The diamond which is synthesized is separated from the substrate. The use of the interrupting layer, composed of the inorganic fine powders, allows ready separation of the diamond from the substrate and the diamond separated is suitable for diaphragms for speakers, heat conductive plates, cutting tools, semiconductors, etc. by appropriately choosing shapes of the substrate. Further, the resulting diamond film can be pulverized, thereby yielding diamond powders which are useful for abrasive tools, cutting tools, etc.

11 Claims, 1 Drawing Sheet (I)

↓

(II)

↓

(III)

(I)

(II)

(III)

PROCESS FOR THE PREPARATION OF DIAMOND

BACKGROUND OF THE INVENTION

1. Field of the Invention

The present invention relates to a process for the preparation of diamond. More particularly, the present invention relates to a process for the preparation of diamond capable of preparing diamond in a film form applicable to film bodies for diaphragms for speakers, heat conductive plates, cutting tools, semiconductors and so on and capable of applying pulverized film bodies to abrasive, cutting tools and so on.

2. Description of Related Art

Diamond film can be utilized for various uses due to its superior characteristics such as hardness, heat resistance, rigidity, etc. Hence, research and development have been made for commercializing the diamond film in various fields.

Generally, the diamond film may be employed in a state in which it is formed on a substrate or it may be employed as a free-standing diamond film without the substrate. For example, a proposal has been put forward for using the diamond film as diaphragms for speakers and so on by taking advantage of its high rigidity. In this case, removal of the substrate is required from the diamond film formed on the substrate. However, there are many instances in which the diamond film is employed in such a state that it is formed on the substrate, so that demands have heretofore been made to improve adhesion of the diamond film to the substrate. Little research has been made so far on technology of readily separating the diamond film from the substrate on which the diamond film is formed or technology of readily removing the substrate from the diamond film formed thereon, and only some proposals have been put forward so far as will be described hereinafter.

For instance, Japanese Patent Publication (kokoku) No. 57,399/1988 discloses technology of separating a diamond film from a substrate with a small thermal conductivity, on whose surface the diamond film is directly formed, by heating the diamond film with heating light and taking advantage of difference in thermal expansion between the diamond film and the substrate.

Further, Japanese Patent Laid-open Publication (kokai) No. 143,498/1984 discloses technology which involves forming a diamond film directly on the surface of metallic substrate and treating the metallic substrate with NaOH or mixed acids consisting of hydrochloric acid, hydrofluoric acid and nitric acid, thereby dissolving the metallic substrate and removing it.

However, the technology as disclosed in Japanese Patent Publication (kokoku) No. 57,399/1988 cannot always achieve ready and uniform separation of the diamond film from the substrate because it takes advantage of the difference in thermal expansion between the diamond film and the substrate. Further, it may present the problem that the separation of the diamond film from the substrate causes distortion. In other words, as the diamond film is formed at temperatures as high as approximately 1,000° C. and then cooled to approximately room temperature, the diamond film may be delaminated partially during the course of cooling the diamond film to approximately room temperature. Another problem is that selection of the substrate is restricted to certain materials because a large difference in thermal expansion is required between the diamond film and the substrate.

Further, the technology as disclosed in Japanese Patent Publication (kokoku) No. 143,498/1984 requires special chemicals for dissolving the metallic substrate, so that it suffers from the disadvantage that it is not efficient due to requirements for after-treatment such as washing, etc. Further, this technology presents the same problem that separation of the diamond film may cause distortion prior to treatment with the chemicals, as the aforesaid technology does.

On the other hand, Japanese Patent Laid-open Publication (kokai) Nos. 161,897/1986 and 161,898/1986 propose technology of using the diamond film in a multi-layer state in which it is integrally formed on a substrate such as alumina, $Si_3N_4$, etc., without separation or removal of the diamond film from the substrate.

However, this technology cannot take advantage of or demonstrate the excellent characteristics inherent in the diamond film, so that it suffers from the disadvantage that such diaphragms for speakers as employ the diamond film in the multi-layer state are poorer in performance than those employing a free-standing diamond film.

In addition to the diamond film, diamond powders are suitable for use is abrasives and sintered bodies of the diamond powders are employed for cutting tools and so on.

Heretofore, the diamond powders have been prepared by synthesizing diamond under high pressure, pulverizing it into the particle sizes required, and then classifying it.

This process, however, has the drawbacks that an apparatus for synthesizing the diamond is too complicated and the resulting diamond powder contains impurities.

Recently, the synthesis of diamond by means of low-pressure vapor phase method using plasma has been established, thereby making it possible to prepare the diamond films of high quality.

Further, many attempts have been made to prepare diamond powders of high quality by taking advantage of the low-pressure vapor phase method.

For instance, Japanese Patent Laid-open Publication (kokai) No. 36,112/1986 proposes a process which involves scratching a surface of the substrate on which diamond is formed upon synthesis from vapor phase, arranging for the surface of the substrate to have a given degree of surface irregularity so as to form plural sites from which the diamond starts depositing, forming diamond particles on the substrate, and then separating the diamond particles from the substrate.

In this process, however, it is extremely hard to control the sites from which the diamond starts depositing. Further, adhesion of the diamond particles to the substrate is so strong that the substrate is required, for instance, to be dissolved with aqua regia or the like in order to provide the diamond particles only.

Further, Japanese Patent Laid-open Publication (kokai) No. 155,295/1986 proposes a method which involves scattering finely pulverized powders of at least one member of metallic silicon, an alloy thereof or a compound thereof to be employed as the nuclei for depositing the diamond on the surface of the substrate and using them for the CVD diamond synthesis method. This process can produce fine diamond particles on the surface-treated substrate with high productivity and at arbitrary density.

This process has the object to provide diamond film with good adhesion to the substrate, so that it presents the problem that the difficulty resides in separating the diamond from the substrate because the resulting diamond is in direct contact with the substrate.

On the other hand, a process for preparing fine diamond powders is proposed in Japanese Patent Laid-open Publication (kokai) No. 156,009/1988, which involves introducing a nucleus for synthesizing diamond into a plasma without forming the diamond directly on the substrate.

However, this process suffers from the difficulties that, since a large number of nuclei for forming the diamond are formed, only fine particles having particle sizes ranging from 0.3 micron to 0.5 microns can be formed. This use is restricted, and control over the particle size of the resulting diamond is hard.

Furthermore, Japanese Patent Laid-open Publication (kokai) No. 231,494/1985 proposes a process for preparing superfine diamond powders characterized by suspending inorganic fine particles, which are not caused to melt in plasma, in a reactor, and Japanese Patent Laid-open Publication (kokai) No. 137,311/1984 proposes a process for synthesizing diamond particles while vibrating and fluidizing powders of the metallic fine particles functioning as nuclei, such as metal fine particles.

This process, however, requires control over both of the state in which the powders functioning as nuclei flow and the reactive state, for example, in which plasma is generated. It is difficult to control both of the fluidizing conditions and the reactive conditions at the same time. Further, this process cannot produce diamond particles of high purity consisting of diamond alone, because the diamond is formed on the nuclei.

A further process for preparing diamond particles is proposed in Japanese Patent Laid-open Publication (kokai) No. 111,707/1989, which involves synthesizing the diamond particles on surfaces of fibrous metal or fibers such as glass fibers, carbon fibers or the like and removing, by dissolving, the fibers.

This process, however, has the drawbacks that it requires a large amount of fibers and the fibers become too bulky, so that the production efficiency of diamond particles is poor from the industrial point of view.

In other words, conventional processes are hard in controlling the synthesis conditions for the preparation of diamond particles or in controlling particle sizes for providing the diamond particles with given particle sizes. Further, they are very difficult to provide the diamond powders of high purity and of high strength.

SUMMARY OF THE INVENTION

The present invention has been achieved under the circumstances as described hereinabove.

The object of the present invention is to provide a process for the preparation of diamond capable of producing diamond film and diamond particles.

In order to achieve the aforesaid object, the present invention consists of a process for the preparation of diamond characterized by forming an interrupting layer comprising inorganic fine powders on a substrate and synthesizing the diamond by means of vapor phase synthesis method.

BRIEF DESCRIPTION OF THE DRAWING

In FIG. 1, reference numeral 1 stands for substrate, reference numeral 2 for an interrupting layer comprising the inorganic fine powders, reference numeral 3 for a diamond film, and reference numeral 4 for inorganic fine powders.

DESCRIPTION OF THE PREFERRED EMBODIMENTS

Figure 1:
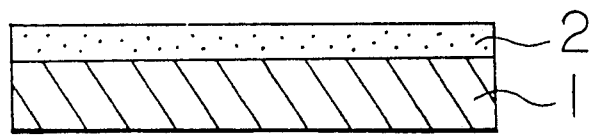
FIG. 1 is a diagrammatic representation showing the process according to the present invention.
Figure 1:
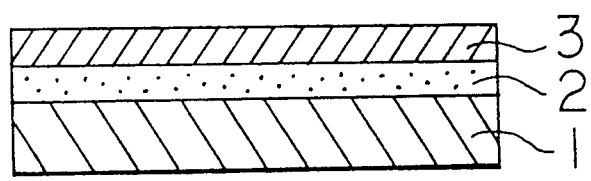
Figure 1:
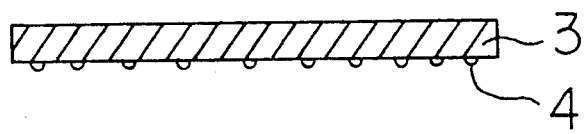
Figure 1:
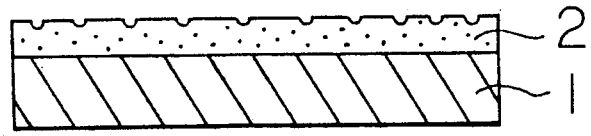

In the process for the preparation of diamond according to the present invention, first, an interrupting layer 2 consisting of inorganic fine powders is formed on substrate 1, such as a base plate or a base body.

The substrate functions as a support during the reaction for the synthesis of the diamond.

The material for the substrate is not restricted to a particular one as long as the interrupting layer composed of the inorganic fine powders can be formed on the surface of the substrate and the material is so heat resistant as to be able to withstand the high temperatures during the reaction for the synthesis of the diamond. The material for the substrate may include, for example, a metal such as iron, copper, cobalt, nickel, chromium, molybdenum, silicon, titanium, manganese, vanadium, thallium, tungsten, tantalum, aluminium, germanium, etc.; an alloy and a compound thereof and an alloy or a compound containing the metal as a major component; carbonaceous materials such as carbon, graphites, etc.; ceramics such as silica, alumina, boron nitride, $Si_3N_4$, etc.; and so on. Among those, it is preferred to use ones having a small coefficient of thermal expansion, such as the VIa group of the metal, e.g. molybdenum, chromium, etc.; the VIII group of the metal, e.g. iron, etc.; and ceramics, e.g. boron nitride, $Si_3N_4$, etc. because those materials are not deformed or do not cause separation from the interrupting layer during the reaction.

No restrictions are placed on the shape of the material for the substrate as long as the material can form the interrupting layer and it can function as a support during reaction for forming the diamond. Specific shape of the material may include, for example, a plane plate such as a disc, a rectangular plate, etc.; a diaphragm for a speaker, e.g. a cone, a horn, a dome, etc.; a solid body, e.g. a cylinder, a prism, a circular cone, etc.; and other unique shapes. The substrate may be in a complex shape. The process according to the present invention can form various shapes of the diamond film in accordance with the shape of the substrate.

As the inorganic fine powders, there may be employed powdery material which is capable of allowing the deposit of diamond thereon yet is easy to separate from the diamond formed thereon. As the material likely to have the diamond deposited thereon, there may be mentioned material to be employed as a nucleus for forming the diamond (or as an agent for generating the nucleus) in synthesizing the diamond. As the material likely to be separated from the diamond, there may be mentioned a material which has the property of readily separating from the substance adhered thereto due to some weak exterior force applied from the outside.

As the inorganic fine powders having those properties as described hereinabove, there may be mentioned, for example, fine powders of SiC, Si, Mo, W, $Al_2O_3$, Ti, Ta, $TiO_2$, h-BN, c-BN, $SiO_2$, $B_4C$, AlN, $Si_3N_4$, WC, MoC, $MoS_2$, etc.

Further, the inorganic fine powders may be powders of layered compounds, although the compounds might overlap with those compounds as described hereinabove. The layered compounds may be in such a crystalline structure (layered structure) that the planes on which the atoms are arranged in a particularly dense state are connected to each other with slightly weakly bonding force and disposed parallel to each other, so that they have the property of readily separating from their layers into thin pieces. In this sense, it is advantageous to achieve the object of the present invention.

As preferred examples of the inorganic fine powders, there may be mentioned, for example, h-BN, graphite, $MoS_2$, Si, SiC, etc., which are heat resistant and lubricative. The Si, $SiO_2$, the metal, etc. can be dissolved with an acid so that pure diamond can be obtained even if the nucleus for forming the diamond is employed.

The inorganic fine powders may be employed solely or in combination of two or more.

The interrupting layer consisting of the inorganic fine powders may be arranged in a single layer or in layers. In this case, for instance, fine powders resulting from the layered compounds such as lubricative h-BN, $MoS_2$, etc. are employed on the side of the substrate, while the diamond fine powders functioning as the nucleus for generating the diamond, SiC, etc. are employed on the side of depositing the diamond.

Particle sizes of the inorganic fine powders are not restricted to a particular one as long as they do not suppress the object of the present invention. In the process according to the present invention as will be described hereinafter, the particle sizes of the inorganic fine powders may range from 0.01 micron to 10 microns, preferably from 0.1 micron to 1 micron, due to readiness to the treatment for separation from the substrate, holding force for holding the interrupting layer consisting of the inorganic fine powders to the substrate, cooling efficiency by heat radiation, separation from the resulting fine diamond particles, and for other reasons.

Although the thickness of the interrupting layer composed of the inorganic fine powders may appropriately be chosen in accordance with the particle sizes of the inorganic fine powders, it may preferably be as thick as 10 times to 1,000 times the particle sizes of the inorganic fine powders. If the thickness of the interrupting layer would be less than ten times the particle sizes of the inorganic fine powders, on the one hand, there may be the risk that the diamond deposited may come into direct contact with the substrate. It the thickness thereof would be larger than 1,000 times the particle sizes thereof, on the other hand, there is the risk that the diamond is separated from the substrate during the synthesis.

The procedures for forming the interrupting layer consisting of the inorganic fine powders may include, for example, spraying, etc., which involves atomizing or dispersing a predetermined quantity of powders in a volatile medium containing a binder, etc. uniformly on the substrate. Other procedures may involve, for example, dispersing the inorganic fine powders uniformly in such a volatile medium by means of supersonic waves, spraying the dispersion onto the surface of the substrate or immersing the substrate in the dispersion or coating the dispersion on the surface of the substrate with a spin coater, a roll coater or the like, and drying the resulting coat. The binder may preferably include polyvinyl butyral, etc., and the volatile medium may preferably include an alcohol, acetone, etc.

Then, the diamond is formed in a layer or in layers on the interrupting layer consisting of the inorganic fine powders as formed in the manner as described hereinabove, as shown in FIG. 1(II).

As the method for the synthesis of the diamond, there may be employed various ones which are conventional and per se known, as long as it involves the vapor phase synthesis. Among those methods, the diamond synthesis by means of the vapor phase method is preferred, which involves bringing plasma gases obtainable by exciting carbon sources gases into contact with the substrate.

More specifically, the gases obtained by exciting the raw material gases containing the carbon sources gases are contacted with the interrupting layer formed on the surface of the substrate in the plasma reacting chamber, thereby forming the diamond on the interrupting layer.

As the raw material gases, there may be any gases containing at least carbon sources gases. Among those gases, gases containing carbon atoms and hydrogen atoms are preferred.

Specifically, as the raw material gases, there may be mentioned, for example, mixed gases composed of carbon sources gases and hydrogen gas.

As needed, a carrier gas such as an inert gas can be employed together with the raw material gases.

As the carbon source gases, there may be employed gases of various hydrocarbons, halogen-containing compounds, oxygen-containing compounds, nitrogen-containing gases, etc. or gases obtainable by gasification of graphite or other carbons.

The hydrocarbons may include, for example, paraffin-series hydrocarbons such as methane, ethane, propane, butane, etc.; olefin-series hydrocarbons such as ethylene, propylene, butylene, etc.; acetylene-series hydrocarbons such as acetylene, allylene, etc.; diolefin-series hydrocarbons such as butadiene, etc.; alicylic hydrocarbons such as cyclopropane, cyclobutane, cyclopentane, cyclohexane, etc.; aromatic hydrocarbons such as cyclobutadiene, benzene, toluene, xylene, naphthalene, etc.; and so on.

The halogen-containing compounds may include, for example, halogenated hydrocarbons such as methane halide, ethane halide, benzene halide, etc.; carbon tetrachloride; and so on.

The oxygen-containing compounds may include, for example, alcohols such as methanol, ethanol, propanol, butanol, etc.; ethers such as methyl ether, ethyl ether, ethyl methyl ether, methyl propyl ether, ethyl propyl ether, phenyl ether, acetal, a cyclic ether (dioxane, ethylene oxide, etc.), etc.; ketones such as acetone, diethyl ketone, benzophenone, pinacolin, methyl oxide, an aromatic ketone (acetophenone, benzophenone, etc.), a diketone, a cyclic ketone, etc.; aldehydes such as formaldehyde, acetoaldehyde, butylaldehyde, benzaldehyde, etc.; organic acids such as formic acid, acetic acid, propionic acid, succinic acid, butyric acid, oxalic acid, tartaric acid, stearic acid, etc.; acid esters such as methyl acetate, ethyl acetate, etc.; divalent alcohols such as ethylene glycol, diethylene glycol, etc.; carbon monoxide, carbon dioxide; and so on.

As the nitrogen-containing compounds, there may be mentioned, for example, mines such as trimethyl amine, triethyl amine, etc., and so on.

Among those carbon source gases, preferred are paraffin-series hydrocarbons such as methane, ethane, propane, etc., which are gaseous at room temperature or high in vapor pressure; ketones such as acetone, benzophenone, etc.; alcohols such as methanol, ethanol, etc.; and the oxygen-containing compounds such as carbon monoxide, carbon dioxide, etc.

The concentration of the carbon source gases in the total gas may usually range from 0.1% to 80% by volume.

The hydrogen gas generates atomic hydrogen when excited.

Although the mechanism is not clarified yet, the atomic hydrogen is considered to show catalytic action of activating the reaction for forming the diamond. Further, it has the action of removing non-diamond components such as graphite, amorphous carbon, etc. which may be deposited together with the diamond.

As means for exciting the raw material gases, there may be mentioned, for example, microwave plasma CVD method, radio frequency (RF) plasma CVD method, DC plasma CVD method, in-magnetic field plasma CVD method, hot filament method, electron assisted CVD (EACVD) method, thermal plasma CVD method, photo assited CVD method, laser-induced CVD method, flame method, sputtering method, ion beams method, cluster's ion beam method, ion plating method, and so on.

Among these means, various CVD methods are preferred, and the plasma CVD method is more preferred.

In the vapor phase method, the temperature of the substrate at the time of forming the diamond film thereon may vary with the method for exciting the raw material gases so that it cannot be determined in a uniform manner. However, it may range usually from 300° C. to 1,200° C., preferably from 500° C. to 1,100° C.

If the temperature would be below 300° C., the velocity of depositing the diamond is too slow or crystallinity of the material deposited may be bad.

On the other hand, if the temperature would exceed 1,200° C., the effect expected to comply with such high temperature cannot be achieved and it is further disadvantageous from the point of view of energy efficiency. Further, the diamond may be converted into graphite.

The reaction pressure under which the diamond film is to be formed may range usually from $10^{-6}$ torr to $10^3$ torr, preferably from $10^{-5}$ torr to 800 torr. If the reaction pressure would be less than $10^{-6}$ torr, on the one hand, the velocity at which the diamond is deposited may be too slow or no diamond may be deposited. If the reaction pressure would be higher than $10^3$ torr, on the other hand, it suffers from the disadvantages that no expected effect can be achieved and an apparatus for synthesis may become so complicated.

The reaction time may appropriately be determined because the reaction time may vary with the surface temperature of the substrate, reaction pressure, particle sizes of the diamond powders required, and so on.

The diamond can be formed in a film shape on the interrupting layer of the substrate over a sufficiently long reaction time. The film thickness of the diamond formed in a film shape is as thick as usually 0.1 micron or more, preferably 0.2 micron or more. If the film thickness would be thinner than the aforesaid film thickness, the coat may not cover the entire surface of the substrate uniformly and independently. It is also possible to provide the diamond particles by controlling the generation of the nuclei or by shortening the reaction time.

In the process according to the present invention, the diamond is formed in a film shape or in a granular shape on the interrupting layer and then removed in such a film shape or a granular shape from the substrate (FIG. 1(III)).

The interrupting layer composed of the inorganic fine powders has the property likely to be removed from the substrate and the diamond formed thereon and it can readily be removed from the substrate and the diamond formed thereon by physical procedures, for example, such as cooling, supersonic, vibration, heat treatment or scratching, thereby yielding highly pure diamond in the film shape or in the granular shape.

The mode of removing the diamond in the film form may vary with the adhesion between the interrupting layer composed of the inorganic fine powders and the diamond or the substrate. For instance, when the adhesion of the diamond to the interrupting layer is weaker than the adhesion of the interrupting layer to the substrate, the diamond can be separated. In this case, the diamond can solely be obtained without further treatment and no after-treatment is required. If the adhesion of the diamond to the interrupting layer would be approximately equal to the adhesion of the interrupting layer to the substrate, both the substrate and the diamond may be separted or removed from the interrupting layer, so that the inorganic fine powders may be left adhering to the diamond (FIG. 1(III)).

If a small amount of the inorganic fine powders would adhere to the diamond removed, they can readily be removed from the diamond by heat treatment, washing, etc. For instance, if the inorganic fine powders would be composed of Mo, the Mo can be removed by heat treatment in air, cooling and washing with an acid, thereby yielding the diamond in high purity.

The reasons for readily removing the Mo in the procedures as described hereinabove are because the Mo is converted into $MoO_3$ upon oxidation and the $MoO_3$ can readily be washed out with an acid weaker than the Mo because the $MoO_3$ can be dissolved with the acid.

On the other hand, when the inorganic fine powders would be made of Si, $SiO_2$, a metal, etc., the inorganic fine powders can readily be dissolved and removed by using a strong acid.

As described hereinabove, the process according to the present invention can form the diamond from the carbon sources gases in the reacting chamber in a stably reactive state by means of a static synthesis method such as the vapor phase method, by using the interrupting layer composed of the inorganic fine powders. By appropriately adjusting the conditions for synthesis, such as the time required for the synthesis of the diamond and treatment for the generation of the nucleus, the powdery or granular diamond of high purity and high strength can be yielded. The diamond in the film form can extensively be employed for diaphragms for speakers, tools, semiconductor material, substrate for heat radiation, etc. and as alternative materials for various films or thin plates.

EXAMPLES

The present invention will be described more in detail by way of examples with reference to comparative examples.

EXAMPLE 1

Boron nitride (h-BN) particles ("BORON SPRAY"; Denki Kagaku Kogyo K. K.) having an average particle size of 0.1 micron was scattered on a Mo substrate having a diameter of 20 mm, thereby forming an interrupting layer composed of the inorganic fine powders, i.e. h-BN, having the thickness of 10 microns.

Then, the diamond was deposited on the interrupting layer by means of the direct current (DC) plasma CVD method under reaction conditions: kind of raw material gases, $CH_4$, $H_2$ and Ar; flow rates of the raw materials gases, 1 liter per minute and 15 liters per minute, and 10 liter per minute, respectively; temperature on the surface of the substrate, 1,020° C.–1,070° C.; pressure, 200 torr; output of power plant, 100 A, 90 V; and reaction time, 20 minutes.

After the deposition of the diamond, it was naturally cooled in vacuum. As a result, the diamond was readily removed from the substrate spontaneously, thereby yielding the diamond in a film form having a film thickness as thick as 80 microns.

The conditions and results are shown in Table 1 below.

EXAMPLE 2

The diamond was synthesized in substantially the same manner as in Example 1 above, except for using substrate composed of Fe and inorganic fine powders composed of silicon carbide (SiC) having an average particle size of 1 micron and the temperatue as high as 1,010° C.–1,050° C.

The results were similar to the results obtained in Example 1 and the resulting film thickness was 60 microns.

The aforesaid conditions and results are shown in Table 1 below.

EXAMPLE 3

Boron nitride (h-BN) particles ("BORON SPRAY"; Denki Kagaku Kogyo K. K.) having an average particle size of 1 micron was scattered on a Cu substrate having a diameter of 20 mm, thereby forming an interrupting layer composed of the inorganic fine powders, i.e. h-BN, having the thickness of 10 microns.

Then, the diamond was deposited on the interrupting layer by means of the microwave plasma CVD method under reaction conditions: kind of raw material gases, CO and $H_2$; flow rates of the raw material gases, 15 sccm and 85 sccm, respectively; temperature on the surface of the substrate, 1,010° C.–1,050° C.; microwave output, 500 W; microwave frequency, 2.45 GHz; pressure, 40 torr; and reaction time, 5 hours.

After the deposition of the diamond, it was naturally cooled in vacuum. As a result, the diamond was readily removed from the substrate naturally, thereby yielding the diamond film of high quality having no cracks and a film thickness as thick as 10 microns.

The aforesaid conditions and results are shown in Table 1 below.

EXAMPLE 4

A dispersion of silicon (Si) powders having an average particle size of 1 micron was coated on a silicon nitride ($SiN_4$) substrate having a diameter of 20 mm, thereby forming an interrupting layer composed of the Si powders.

Then, the diamond was deposited on the interrupting layer by means of the hot filament method under reaction conditions: kind of raw materials gases, $CH_4$ and $H_2$; flow rates of the raw materials gases, 0.5 sccm and 49.5 sccm, respectively; temperature on the surface of the substrate, 850° C. to 1,000° C.; filament is made of tungsten; pressure, 30 torr; and reaction time, 5 hours.

After the deposition of the diamond, it was naturally cooled in vacuum. As a result, the diamond was readily removed from the substrate, thereby yielding the diamond film of high quality having no cracks and a film thickness as thin as 8 microns.

The aforesaid conditions and results are shown in Table 1 below.

EXAMPLE 5

Boron nitride (h-BN) particles ("BORON SPRAY"; Denki Kagaku Kogyo K. K.) having an average particle size of 1 micron was scattered on a Mo substrate having a diameter of 20 mm, thereby forming an interrupting layer composed of the inorganic fine powders, i.e. h-BN.

Then, the diamond was deposited on the interrupting layer by means of the direct current (DC) plasma CVD method under reaction conditions: kind of raw materials gases, $CH_4$, $H_2$ and Ar; flow rates of the raw materials gases, 1 liter per minute, 15 liters per minute, and 10 liters per minute, respectively; temperature on the surface of the substrate, 950° C.–1,050° C.; pressure, 200 torr; output of power plant, 100 A, 90 V; and reaction time, 10 minutes.

After the deposition of the diamond, it was subjected to supersonic treatment for 5 minutes in acetone, thereby removing the diamond from the substrate.

As the resulting diamond in a powdery form contained a small amount of h-BN powders, it was separated and purified by using an aqueous solution of 1,1,2,2-tetrabromoethane having a specific gravity of 2.5.

The resulting powdery diamond of high purity had particle sizes ranging from 1 micron to 5 microns.

The aforesaid conditions and results are shown in Table 1 below.

EXAMPLE 6

A dispersion of molybdenum powders having an average particle size of 1 micron was coated on a molybdenum substrate having the diameter of 20 mm, and the coat was dried forming an interrupting layer composed of Mo powders having the thickness of 10 microns.

The diamond film was then formed on the interrupting layer by means of the hot filament method. The reaction conditions were: kind of raw material gases, $CH_4$ and $H_2$; flow rates, 0.5 ml per minute and 49.5 ml per minute, respectively; temperature on the surface of the substrate, 850° C. to 1,000° C.; filament, tantalum; pressure, 30 torr; and reaction time, 5 hours.

After the deposition of the diamond film, it was naturally cooled in vacuum, thereby readily removing the diamond film from the substrate and yielding the self standing diamond film having the film thickness as thick as 5 microns.

COMPARATIVE EXAMPLE 1

The diamond was deposited directly on the surface of the Mo substrate in a film form as thick as 80 microns in substantially the same manner as in Example 1, except for the formation of no interrupting layer composed of inorganic fine powders on the substrate, the use of non-scratched substrate, and the reaction time of 30 minutes.

After the deposition of the diamond, it was cooled in vacuum. As a result, the diamond was cracked during the course of cooling, a portion of the film was broken and scattered. Further, a portion of the diamond film adheres to the substrate so strongly that the diamond could not partially be removed from the substrate.

ders formed on the substrate and the diamond of high purity and strength can be prepared.

TABLE 1

| | CONDITION | | | | | | RESULT | | |
|---|---|---|---|---|---|---|---|---|---|
| | MATERIAL FOR SUBSTRATE | INORGANIC FINE POWDER | MEANS FOR EXCITING | FLOW RATES OF GAS | | | TEMPERATURE OF SUBSTRATE | REACTION TIME & PRESSURE | THICKNESS OF DIAMOND | DELAMINATION |
| | | | | $CH_4$ | $H_2$ | Ar | | | | |
| EX. 1 | Mo*1 | h-BN*2 | DC PLASMA CVD | 1 l/min | 15 l/min | 10 l/min | 1020~1070° C. | 20 min 200 torr | 80 μm | GOOD |
| EX. 2 | Fe*1 | SiC | DC PLASMA CVD | 1 l/min | 15 l/min | 10 l/min | 1010~1050° C. | 20 min 200 torr | 70 μm | GOOD |
| EX. 3 | Cu*1 | h-BN*2 | MICROWAVE PLASMA CVD | CO 15 sccm | 85 sccm | — | 1010~1050° C. | 5 hr 40 torr | 10 μm | GOOD |
| EX. 4 | *1 $Si_3N_4$ | Si | HOT FILAMENT METHOD | 0.5 sccm | 40.5 sccm | — | 850~1000° C. | 5 hr 30 torr | 8 μm | GOOD |
| EX. 5 | Mo*1 | h-BN*2 | DC PLASMA CVD | 1 l/min | 15 l/min | 10 l/min | 950~1050° C. | 10 min 200 torr | PARTICLES | GOOD |
| EX. 6 | Mo | Mo | HOT FILAMENT METHOD | 0.5 ml/min | 49.5 ml/min | — | 850~1000° C. | 5 hr 30 Torr | 5 μm | GOOD |
| CO. EX. 1 | Mo*1 *3 | — | DC PLASMA CVD | 1 l/min | 15 l/min | 10 l/min | 1030~1060° C. | 30 min 200 torr | 80 μm | NOT GOOD |
| CO. EX. 2 | Si*1 | — | MICROWAVE PLASMA CVD | 15 sccm | 85 sccm | — | 1010~1050° C. | 5 hr 40 torr | 10 μm | NOT GOOD |
| CO. EX. 3 | Mo*1 | — | DC PLASMA CVD | 1 l/min | 15 l/min | 10 l/min | 950~1050° C. | 10 min 200 torr | PARTICLES | NOT GOOD |

*1 DIAMETER 20 mm φ
*2 PREPARED BY DENKI KAGAKU KOGYO K.K.
*3 NO SURFACE TREATMENT

The aforesaid conditions and results are shown in Table 1 below.

COMPARATIVE EXAMPLE 2

The diamond was deposited directly on the surface of the substrate in a film form as thick as 10 microns in substantially the same manner as in Example 3, except for the formation of no interrupting layer composed of the inorganic fine powders on the substrate and the use of a Si substrate.

After the deposition of the diamond, it was cooled in vacuum. As a result, the diamond could not be removed from the substrate at all because it strongly adhered to the substrate.

The aforesaid conditions and results are shown in Table 1 below.

COMPARATIVE EXAMPLE 3

The diamond was deposited directly on the surface of the substrate in substantially the same manner as in Example 5, except for formation of no interrupting layer composed of the inorganic fine powders on the substrate.

As a result, the diamond was deposited over the entire surface of the Mo substrate. However, the diamond could not be removed from the substrate by the treatment with supersonic waves, etc., thereby yielding no objective diamond in a powdery form.

The aforesaid conditions and results are shown in Table 1 below.

EVALUATION

As a result of comparison of the working examples with the comparative example, it is confirmed that the diamond synthesized can readily be removed from the interrupting layer composed of the inorganic fine pow-

What is claimed is:

1. A process for preparing diamond by vapor phase synthesis comprising:
   forming an interrupting layer of inorganic powders comprising at least one member selected from the group consisting of SiC, Si, Mo, W, $Al_2O_3$, Ti, Ta, $TiO_2$, h-BN, c-BN, $SiO_2$, $B_4C$, AlN, $Si_3N_4$, WC, MoC, graphite, and $MoS_2$, which have an average particle size of 0.01 to 10 μm, on a surface of a substrate, said interrupting layer having a thickness of 0.1 microns or more so that the entire surface of said substrate is substantially uniformly covered;
   depositing diamond on the surface of the interrupting layer with excited raw material gases contacting carbon source gases; and
   separating the diamond from the interrupting layer.

2. A process as claimed in claim 1, wherein the thickness of said interrupting layer is 10 times to 1,000 times the particles sizes of the inorganic powders.

3. A process as claimed in claim 1, wherein the raw material gases are excited by plasma or thermal CVD method.

4. A process as claimed in claim 1, wherein temperature on a surface of the substrate ranges from 300° C. to 1,200° C. when the excited raw material gases are brought into contact with the interrupting layer.

5. A process as claimed in claim 1, wherein reaction pressure for synthesizing diamond ranges from $10^{-6}$ torr to $10^3$ torr.

6. A process as claimed in claim 1, wherein the diamond synthesized is separated in a film form or in a granular form.

7. A process as claimed in claim 1, wherein the diamond synthesized is separated in a film form and pulverized to thereby yield poly-crystalline diamond powders.

8. A process as claimed in claim 1 wherein said interrupting layer comprises a powder of at least one member selected from the group consisting of SiC, Si, Mo, W, Al$_2$O$_3$, Ti, Ta, TiO$_2$, h-BN, c-BN, B$_4$C, AlN, Si$_3$N$_4$, WC, MoC, graphite, and MoS$_2$ directed toward said substrate and a layer of diamond powder directed toward said diamond deposition.

9. A process as claimed in claim 1 wherein said powder is at least one member selected from the group consisting of h-BN, graphite, MoS$_2$, Si, and SiC.

10. A process as claimed in claim 1 wherein said formed diamond becomes adhered to some of said powder during the deposition thereof, such diamond adhered to said powder is separated from said substrate, and then said adhered powder is separated from said diamond.

11. A process as claimed in claim 1 wherein said powder completely covers said substrate and substantially prevents said diamond from contacting said substrate.

* * * * *